United States Patent [19]
Deley et al.

[11] Patent Number: 5,559,727
[45] Date of Patent: Sep. 24, 1996

[54] APPARATUS AND METHOD FOR DETERMINING THE POSITION OF A COMPONENT PRIOR TO PLACEMENT

[75] Inventors: Michael T. Deley, Warrington; Edwin R. Phillips, Rosemont, both of Pa.

[73] Assignee: Quad Systems Corporation, Horsham, Pa.

[21] Appl. No.: 201,369

[22] Filed: Feb. 24, 1994

[51] Int. Cl.$^6$ .................................................. G01B 11/00
[52] U.S. Cl. .......................... 364/559; 382/151; 356/375; 356/400
[58] Field of Search ............................ 364/559; 356/375, 356/376, 399, 400; 382/141, 145, 146, 151

[56] References Cited

U.S. PATENT DOCUMENTS

| | | | |
|---|---|---|---|
| 5,249,239 | 9/1993 | Kida | 382/146 |
| 5,278,634 | 1/1994 | Skunes et al. | 356/400 |
| 5,309,223 | 5/1994 | Konicek et al. | 356/375 |

*Primary Examiner*—Emanuel T. Voeltz
*Assistant Examiner*—Edward Pipala
*Attorney, Agent, or Firm*—John B. Sowell, Att

[57] ABSTRACT

Apparatus and a method for determining the position of a component held on the end of a pick up tool includes a pick up tool and positioning sensing system mounted on a movable frame with each other. The position sensing system includes an adjustable light source for producing an intense fan of light onto a collimating lens. The collimating lens produces an object field comprising a thin wide sheet of collimated light to be projected on a component held by the pick up tool. The thin wide sheet of light is projected on a component whose position is to be determined and the unblocked rays of light are projected onto an objective focusing lens which focuses the unblocked light through a very small aperture onto a relay lens which receives the refocused unblocked rays of light and produces refocused collimated light rays which are directed as an image onto a linear array sensor having a plurality of high density pixel sensors whose position is known relative to the pick up tool. The component whose position is to be determined is rotated in the imaging field. A computer/controller is coupled to the linear array sensor and an encoder for producing sets of X, Y and θ data indicative of the refocused collimated light rays projected onto said pixel sensor and the computer/controller is programmable for analyzing said digital data and for determining the X, Y and θ position of the component on the pick up tool.

14 Claims, 7 Drawing Sheets

APPARATUS AND METHOD FOR DETERMINING THE POSITION OF A COMPONENT PRIOR TO PLACEMENT

BACKGROUND OF THE INVENTION

1. Field of the Invention

The present invention relates to apparatus for centering components or objects relative to a pick up tool prior to placement on a workpiece. More particularly, the present invention relates to an apparatus for optically and electronically determining the X, Y and rotational position (-Θ-) of a component after being picked up by a pick up tool and prior to placement on a workpiece to permit correction of the position of the pick up tool to compensate for misalignment of the component thereon.

2. Description of the Prior Art

Pick and place machines for placing small electrical and electronic components on printed circuit boards and substrates are well known and are commercially available from U.S. companies such as Quad Systems Corporation in Horsham, Pa. and from Universal Instruments Corporation in Binghamton, N.Y.

Automatic component placement machines, known as pick and place machines have heretofore employed centering devices, centering chucks and end effectors which physically center or reposition the electrical and electronic components on the end of a pick up tool prior to placement on a workpiece. Such mechanical devices are typical of those shown in Quad U.S. Pat. No. 4,987,676 and Universal U.S. Pat. No. 4,135,630 which employ centering fingers to physically move the components on the end of the pick up tool to a desired predetermined position prior to placement.

Electronic equipment is being miniaturized to increase operating speeds as well as to effect reliability and reduce cost. Typical resistors, capacitors and other discrete components are now so small that they can no longer be accurately positioned or repositioned on a pick up tool by physically moving the component. Some components and semiconductor devices have electronic terminals or leads on their sides, as well as the bottom and top surfaces which further prevent physically moving and realigning the component on a pick up tool.

It is well known that robotic arms which are capable of multiple axes movement and placement of objects have backlash errors which decrease the accuracy of placement of the object or component. To overcome the inherent backlash error in such systems, the robotic arm is moved to a positioning station at a known predetermined position near the work piece. Either the object and/or the robotic arm is then sensed by various forms of remote sensors at the scanning or sensing station without physically touching the robotic arm. The sensor determines the deviation of the robotic arm between its desired position and from the known position and the error is used to calculate the final movement of the robotic arm to place the object or component at a more accurate desired position.

U.S. Pat. No. 4,615,093 shows an adaptation of a position scanning station placed intermediate a component pick up station and a work piece. The scanning station employs laser beams to effect reflection or shadowing position techniques as well as using mechanical scanning.

The prior art scanning stations depicted in this U.S. Pat. No. 4,615,093 and references cited therein are expensive and slow down the speed of operation of a pick and place machine which must be moved to the scanning station to effect the scanning and repositioning calculation prior to placement at a work piece for correction of component presentation errors.

SUMMARY OF THE INVENTION

It is a principal object of the present invention to provide an improved apparatus and method for determining the position of a component while it is positioned on a pick up tool.

It is another principal object of the present invention to provide a position sensing apparatus for inspecting the Z height, standoff height, and bent or mispositioned leads in the Z axis of a component prior to placement of the component.

It is another principal object of the present invention to determine the position of a component on a pick up tool while continuously moving the pick up tool from a pick up station to the workpiece.

It is another principal object of the present invention to provide a novel and improved component sensing and positioning apparatus.

It is another principal object of the present invention to provide a novel and highly accurate electro optical light projection component sensing and positioning apparatus or system.

It is another principal object of the present invention to provide a method and apparatus for determining the presence of bent or deformed leads on a component prior to any attempt to place the component in or on a work piece.

It is a general object of the present invention to provide a component position sensing apparatus that has no moving parts, is highly accurate and employs no expensive parts yet is able to position a wide variety of components such as small brick-shaped components, components with J-leads, Gull wing leads, Butt leads and various types of stand-off leads such as Ball grid areas (BGA)

Small Outline Integrated circuits (SOIC)

Thin Small Outline Package (TSOP) and

Very Small Outline Package (VSOP), and other components and semiconductor devices.

It is a general object of the present invention to provide a positioning apparatus that performs an inspection function of the size of a component as well as the condition of leads of the component prior to placement.

According to these and other objects of the present invention, there is provided mounted on a pick up spindle transport and support frame of a pick and place machine, a component position sensing apparatus which comprises a high intensity light source which is uniformly spread and optically focused to provide a thin parallel field or a thin sheet of light that is projected onto or through a component which blocks a portion of the sheet of light. The unblocked portion of the sheet of light is passed through an optical system and projected onto a linear array image sensor which generates a plurality of unique wave form patterns as the pick up tool is rotated. The uniform patterns are digitized and analyzed in a computer/controller which is provided with software capable of determining the X, Y and -Θ- orientation of the component or device relative to the position of the pick up tool to enable the computer/controller to compensate for the misalignment of the component on the pickup tool by correcting the placement position of the component.

DETAILED DESCRIPTION OF A PREFERRED EMBODIMENT

Figure 1:
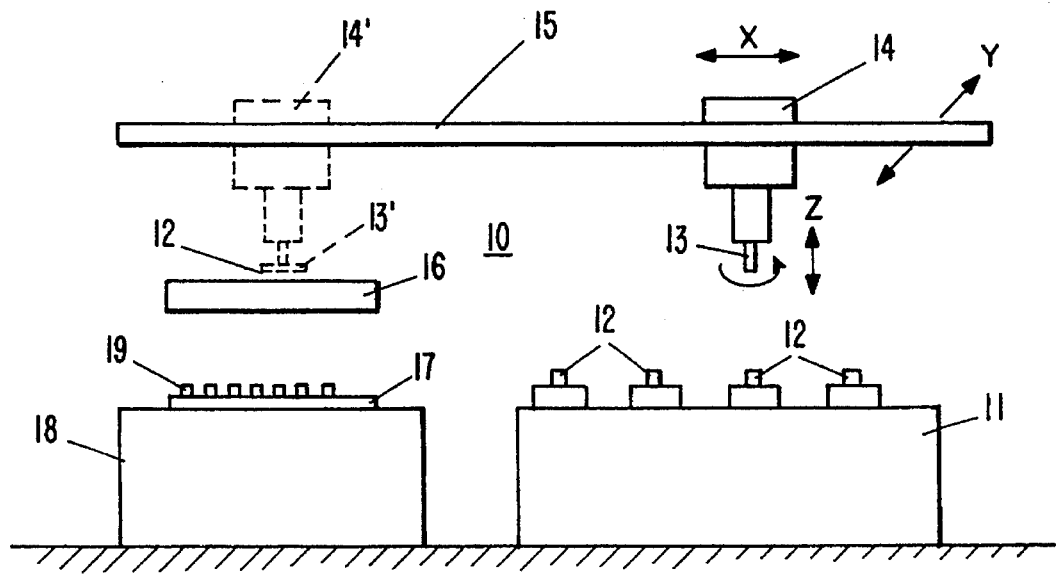
FIG. 1 is a schematic drawing in elevation view showing a typical prior art pick and place apparatus having a position scanning station intermediate the pick up station and the placement station.

Refer now to FIG. 1 showing a schematic drawing in elevation of a typical prior art pick and place apparatus 10. The depicted pick and place apparatus comprises a pick up station 11 shown having a plurality of components 12 mounted thereon for pick up by the pick up tool 13. The pick up tool 13 is mounted for rotational and Z or vertical movement on the head 14. Head 14 is shown mounted for movement in the X direction on a carriage 15 which is movable in the Y direction. When the head 14 is moved after picking up a component 12 to the position shown at 14' the component 12 on pick up tool 13' may be inserted into the scanning station 16 to determine the position of the component 12 as will be explained hereinafter. After determining the position of the component 12, the component is mounted on a work piece 17 shown supported by a work station 18 along with other already mounted components 19.

Figure 2:
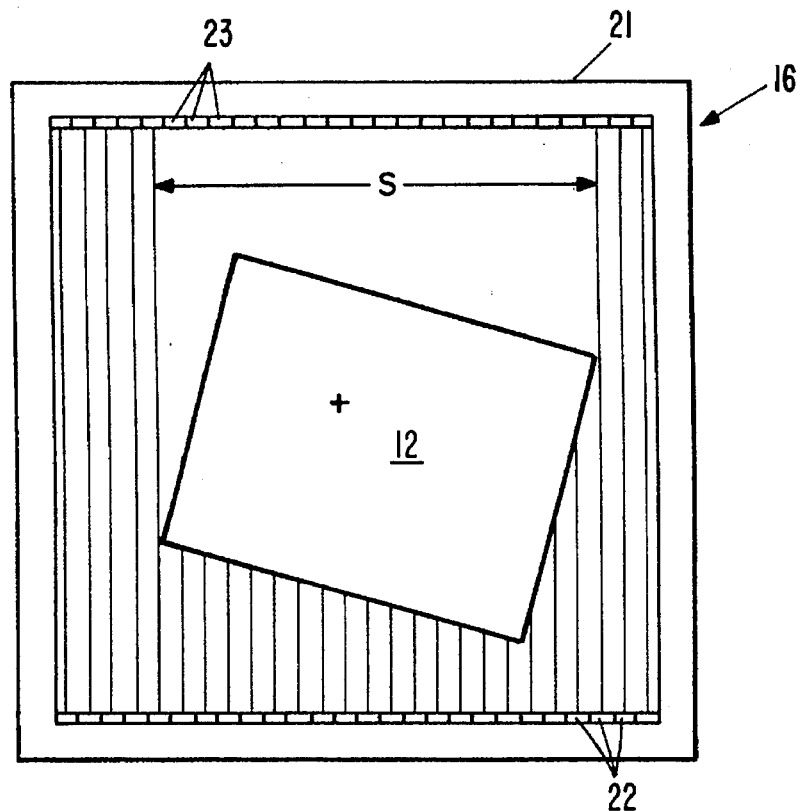
FIG. 2 is a schematic drawing in plan view showing a prior art scanning station which employs a plurality of discrete laser beams and a similar plurality of sensors.

Refer now to FIG. 2 showing a schematic drawing in plan view of a prior art scanning station 16. The scanning station 16 comprises a sensor frame 21 which supports a plurality of laser emitters 22 on one side of the frame and opposite the laser emitters 22 are a plurality of laser detector elements 23, one for each of the laser emitters. The component 12 is shown intercepting laser beams 24 which cast a shadow S representative of the component 12 on the laser detectors 23. By properly analyzing the shadow and the number of detector elements in the shadow, the X, Y, and Θ position of the component 12 may be determined provided that an encoder is used in conjunction with the rotational drive of the pick up tool 13.

Figure 3:
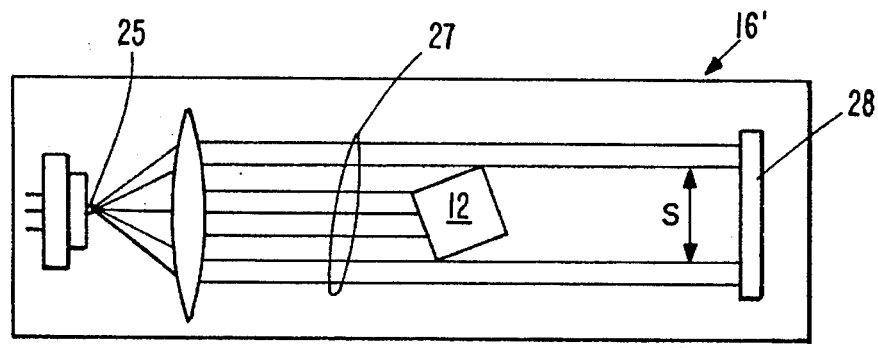
FIG. 3 is a schematic drawing and plan view showing the elements of another prior art scanning station which employs a single laser light source and a plurality of sensors.

Refer now to FIG. 3 showing the structural elements of another prior art scanning station 16' which employs a single laser light source 25 in conjunction with a lens element located at its focal distance from the light source 25 to produce a collimated source of light 27. The component 12 intercepts part of the light 27 and cast a shadow S onto the linear array 28. A controller would be required to interpret the position of the shadow while the component 12 is rotated in order to determine the X, Y, and Θ component relative to the scanning station 16.

Figure 4:
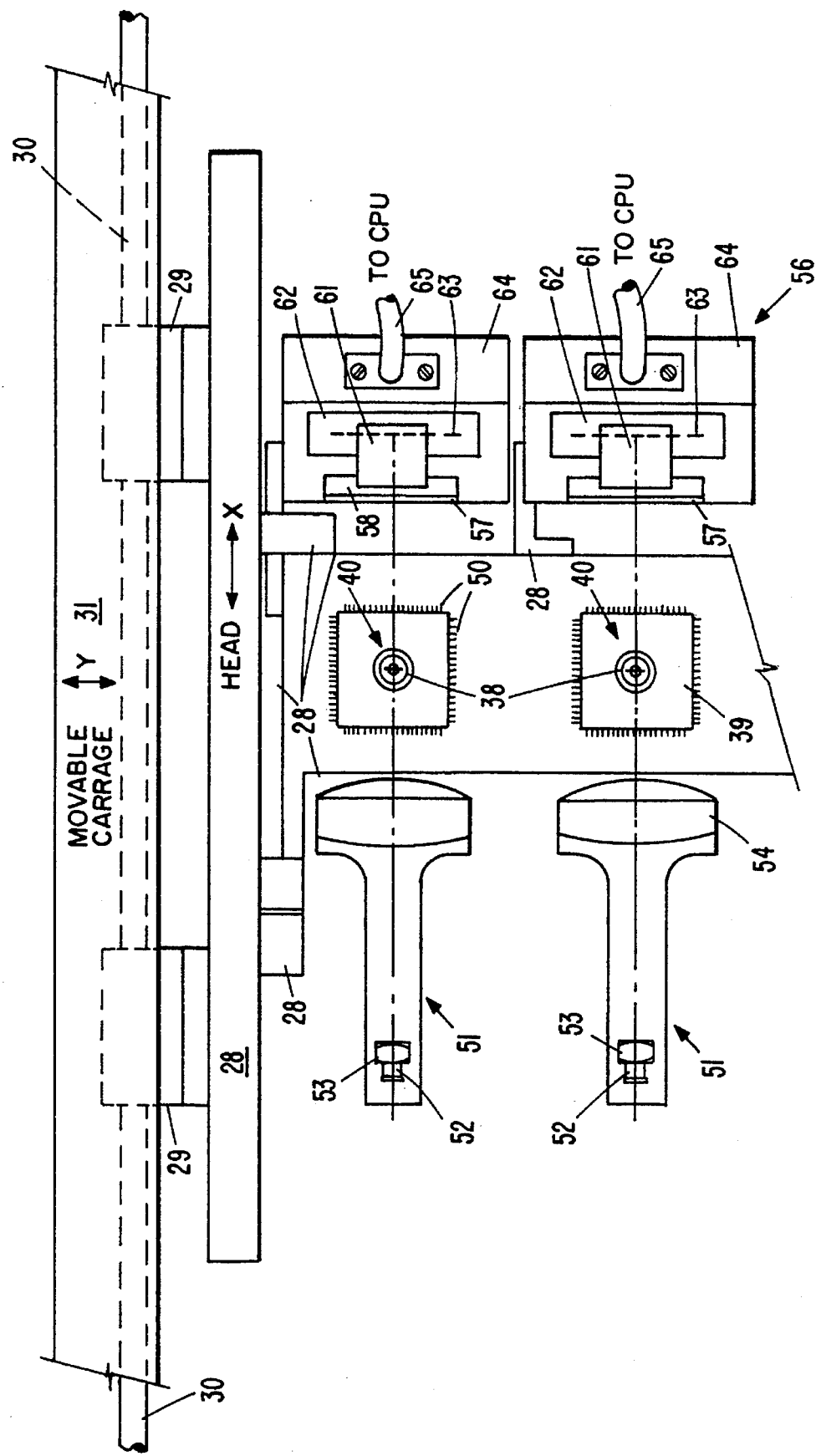
FIG. 4 is a plan view of a dual spindle pick up head showing the placement of structural elements of a preferred embodiment positioning apparatus on the head.
Figure 5:
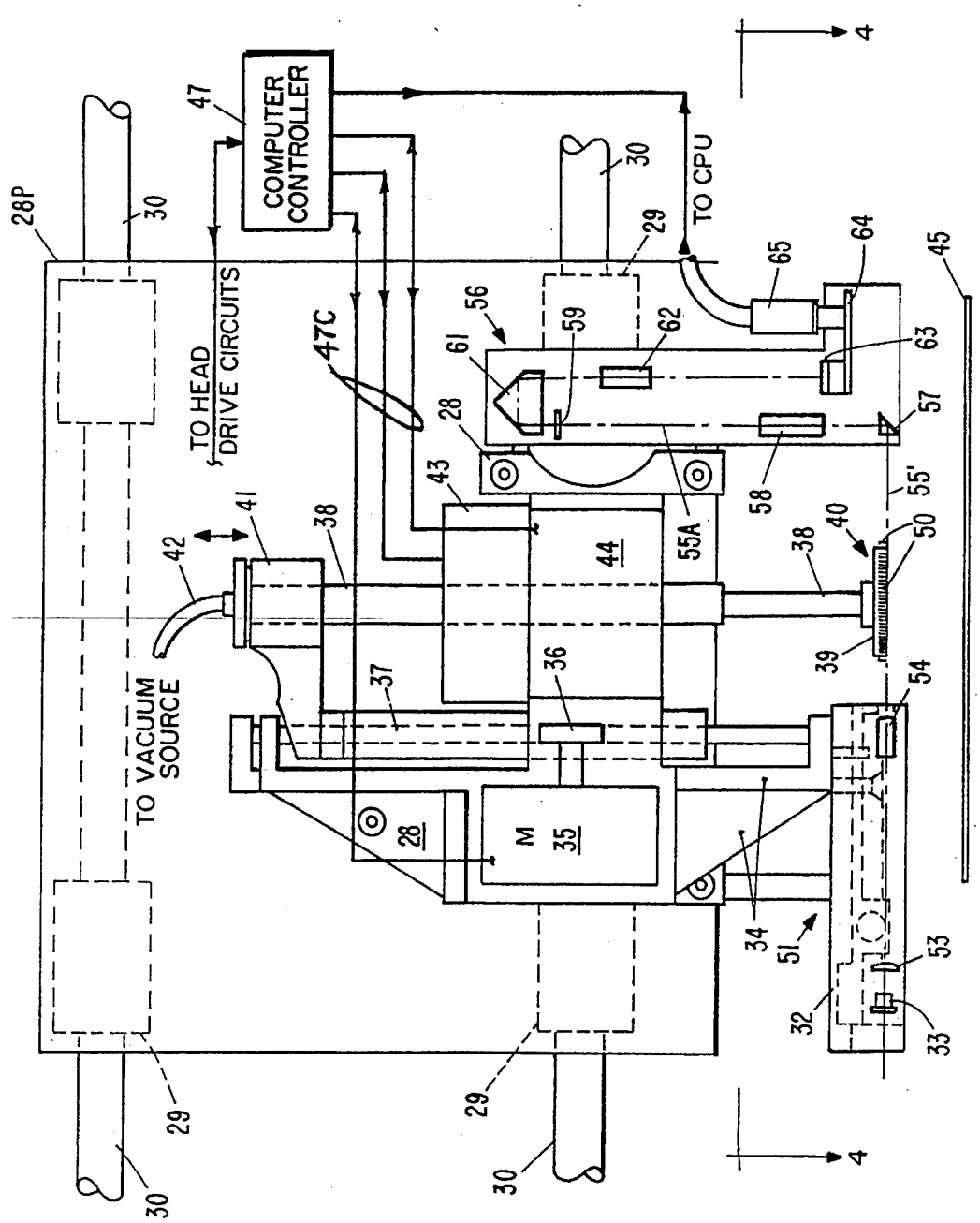
FIG. 5 is an elevation view of the pick up head of FIG. 4 showing the placement of structural elements of the preferred embodiment positioning apparatus on the head.

Refer now to FIG. 4 which is a partial section taken at lines 4—4 of FIG. 5 and is a plan view of a dual spindle pick up head showing the placement of structural elements of the preferred embodiment apparatus mounted on the head. A movable carriage 31 is movable in the Y direction and carries a plurality of bar type ways 30 on which bearings 29 are mounted. The bearings 29 are fixed to the head 28 which is movable in the X direction. Also mounted on the head 28 are structural support elements which support the receiver detector station 56 and the illuminator station 51 of the sensor system. The illuminator assembly 51 comprises a bright LED 52 which is adjustably mounted in a sleeve opposite defusing lens 53. The defused light field is projected onto or through a positive collimating lens 54 to produce the aforementioned thin sheet of collimated light 55 which is projected onto the semiconductor component 39 having depending leads 50 inserted in the path of the collimated light in the object field 55. The spindle 38 mounted on the head 28. The pick up tool 40 is movable in a vertical or Z direction as well as in a Θ direction.

Figure 6:
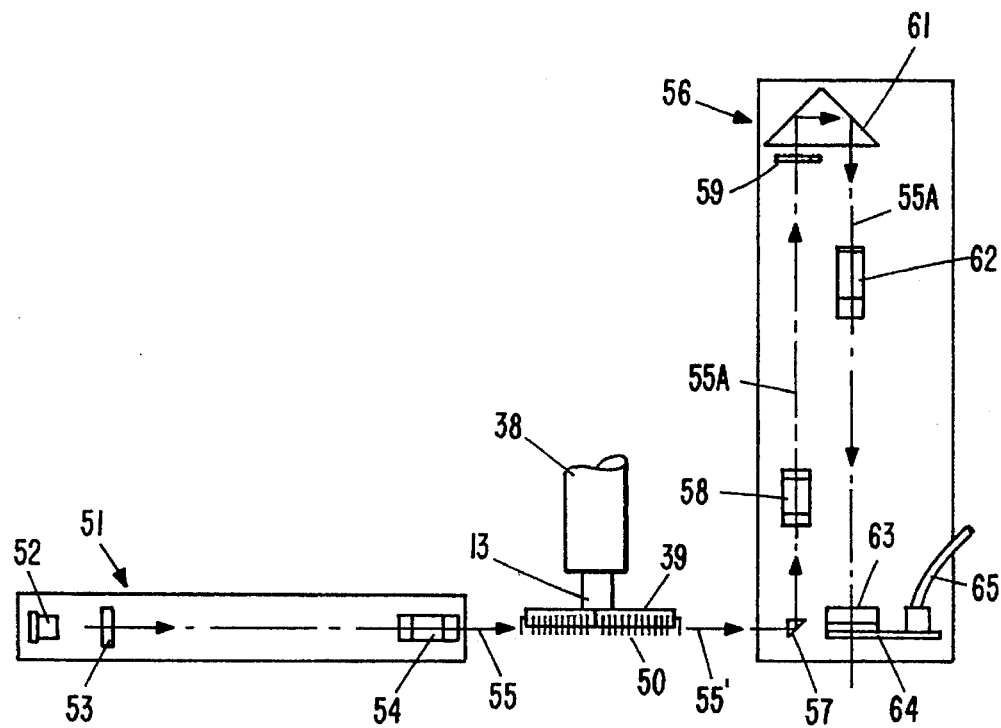
FIG. 6 is a schematic drawing in elevation of a preferred embodiment positioning apparatus shown in FIGS. 4 and 5.

Also mounted on the head 28 is the receiver/detector assembly 56 best shown in FIG. 6. The mounting brackets are shown sectioned as part of the head 28. The receiver detector assembly 56 comprises a prism 57 shown below the positive objective lens 58 and below the 180° roof prism 61. The beam of light 55' is reversed in the prism 61 by 180° and projected downward through the relay lens 62 onto the high density linear array (CCD). Circuits for the sensor 63 are mounted on the printed circuit board 64 which is provided with a cable connector 65 which connects to the computer processor 47 shown on FIG. 5.

Refer now to FIG. 5 which is an elevation view of the pick up head 28 of FIG. 4 showing the placement of the structural elements of the preferred embodiment positioning apparatus. Head 28 is shown having a plate 28P connected to bearings 29 which are mounted for movement with the head on the ways 30. Structure for moving the head 28 is not shown. The illuminator assembly 51 is shown having a illuminating support housing 32 which supports and contains the bright LED light source 33 positioned opposite a positive diffusing lens 53 which produces the band of light L shown in FIG. 7 which is projected onto the positive collimating lens 54 which produces the illuminating object field 55 described hereinbefore. The thin sheet of light which comprises the illuminating field 55 is shown projected through the downward depending leads 50 from an electronic device 39. The device 39 is shown held in place by the pick up tool 40 which is on the end of the spindle 38. The spindle 38 is shown having a spindle support bracket 41 at the upper end and a vacuum source 42 connected to the center of the spindle which is coupled to the vacuum tool 40. The spindle support bracket 41 and the vacuum hose 42 are moved up and down by a Z drive motor 35 which is affixed to the head or frame 28 and is provided with a pinion 36 which cooperates with the rack 37 on the spindle bracket or support 41 imparting Z motion to tool 40. The spindle 38 is also rotatable on its vertical axis about the center line of the spindle 38 by the motor 44 also mounted on the head or frame 28.

The unblocked light which passes through depending leads 50 impinges on the prism 57 and is diverted 90° upward through the objective lens 58. The objective lens focuses the light at the narrow slit (not shown) in the aperture plate 59 and passes through the 180° roof prism 61 and is directed downward through a positive relay lens 62 and onto a linear array 63 which is connected to the substrate or printed circuit board 64. The logic circuit for the linear array 63 is connected via connector 65 to a computer/controller 47 which is also connected to the motors 35 and 44 and their encoders as well as the encoder 43. It will be understood that the programmable computer/controller 47 is located remotely from the sensing circuit shown in FIGS. 4 and 5 and is capable of positioning and operating the motors and servos which move the head 48 and the carriage 31 via control lines 47C. Thus the connection shown to the computer 47 are schematic circuits and are not intended to portray actual connections.

Once the component or device 39 is placed in the object field the computer/processor 47 will perform a series of operations programmable in its memory which rotate the component in the field 55 and collects information from the sensors 63 which enables the computer/controller 47 to determine: the width and length of the components as well as the Z position in the vertical axis of the leads, the tip of the pick up tool 40, the bottom and the top of the components or the ends of the leads as will be explained in greater detail hereinafter. Once the rotational and X, Y position of the component or device 39 is determined relative to the vertical axis of the pick up tool 40, the computer 47 can generate the error correction for the error displacement of the component on the tool 40 so that the device or component may be properly placed on a printed circuit board or substrate 45. The operation of pick and place machines and machines for automatic assembly of electrical components is well known and does not require a detailed explanation herein. It is sufficient to note that the dual head and associated dual illumination assemblies and dual receiver assemblies may be operated by the same computer/controller 47. It is more efficient for two or more such pick up tools to be arranged on a single head 28 which is first positioned at a pick up station before being transported to the placement station. Since the component feeder bins at the pick up station are very closely aligned, two components or devices may be picked up simultaneously on the two pick up tools shown. In like manner when the head assembly and two pick up tools are realigned over a printed circuit board they may rapidly sequentially place two components in approximately the same time it would take for the pick up and placement of a single component.

Refer now to FIG. 6 showing a schematic drawing in elevation of the preferred embodiment positioning apparatus shown in FIGS. 5 and 6. The illumination assembly 51 is shown schematically to comprise a bright non-coherent light source 52 and a positive diffusing lens 53 which generates a thin fan of light that is directed through a positive collimating lens 54 to produce parallel rays in a thin wide sheet of light 55. The sheet of light 55 is shown passing through a plurality of leads 50 vertically protruding from the semiconductor component 39 being held by the pick up tool 13. The pick up tool 13 is mounted on and in a spindle 38 and is capable of rotational as well as vertical Z movement. The thin wide sheet of light 55 comprises the light that is not blocked by the depending leads and is directed onto a right angle prism 57 where it is directed upward through a positive objective lens 58. The unblocked sheet of light 55' is preferably converged through an aperture plate 59 and passes through a 180° prism 61. The light path 55A is then directed downward through a positive relay lens 62 which projects the image of the leads 50 onto the linear array 63. Stated differently, the light which passes through the leads 50 is refocused onto the linear array 63 as an image. The linear array is preferably a high density charge couple device (HDCCD). The signals produced by the linear array are clocked out by a computer/processor (not shown) which is coupled by a connector 65 and circuit board 64 to the processor.

Figure 7:
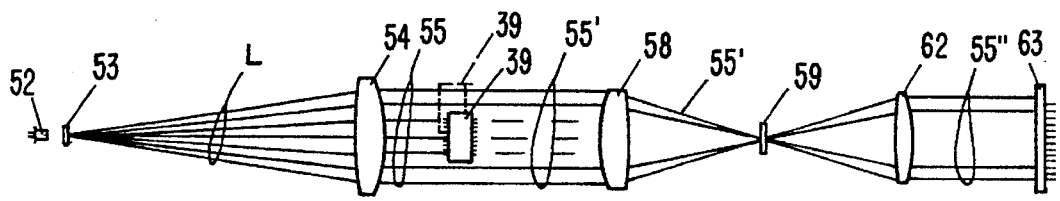
FIG. 7 is a schematic drawing in plan view showing the sheet of light which is projected onto a component and the unblocked portion of the sheet of light which is projected onto the sensor to be sensed and analyzed.

Refer now to FIG. 7 showing a schematic drawing in plan view of the sheet of light which is projected onto a component and the unblocked sheet of light which is projected onto a sensor. The bright source LED 52 produces non-coherent light which is projected onto a positive diffusing lens 53 which is preferably a simple lens to produce a fan of diffused rays of light L that is collimated by the positive collimating lens 54 to produce a sheet of light 55 that is projected onto the depending leads 50 of the semiconductor component 39. The light passing through component 39 produces a sheet of unblocked light 55' which is projected onto a positive objective lens 58 which converges the image of the unblocked light through an aperture 59 and is further projected and refocused onto a positive relay lens 62 to again produce a refocused image in back focus field 55" of the unblocked light 55' onto a linear array sensing element 63.

The sensing array 63 is coupled to the computer/processor 47 shown in FIG. 5 which clocks out the information from the linear array 63 and stores it in memory as digital information. To simplify the explanation of the analysis of the information produced by the linear array, a plurality of wave forms showing the treatment of the information will be explained in greater detail hereinafter.

Figure 8:
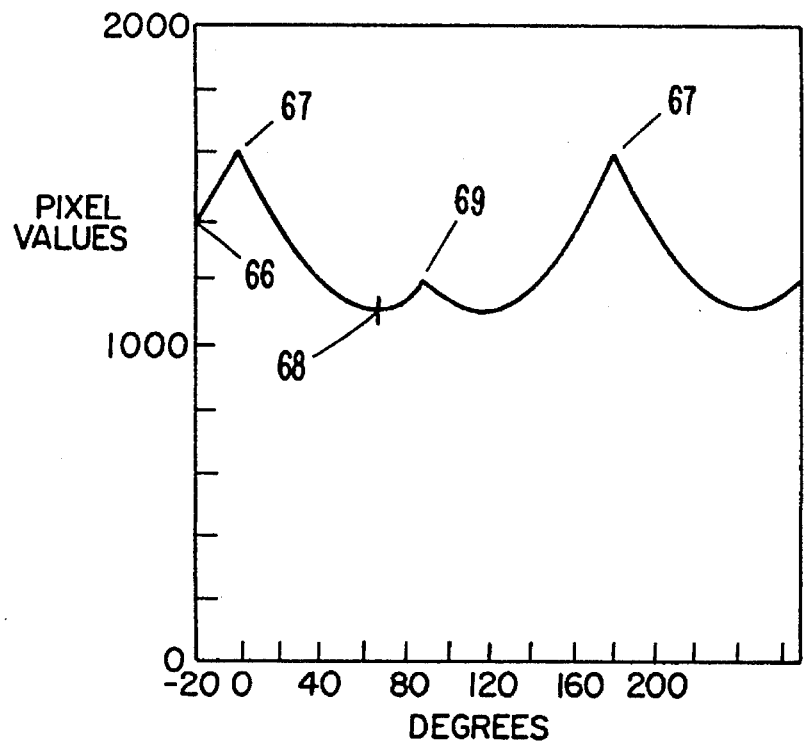
FIG. 8 is a schematic wave form representation of the sum of unblocked light on pixel elements showing the effect of rotating a brick component through approximately 360° to determine its Θ orientation.

Refer now to FIG. 8 showing a schematic representation wave form of the sum of the unblocked light on pixel elements that are produced when the sheet of light 55 is projected on a brick or solid element with an aspect ratio of 2 in a manner similar to that shown in FIG. 7 where the unblocked light is at the edge portion of the component only. To further simplify the explanation it will be understood that the pickup tool is first rotated approximately 20° in a negative direction to eliminate any possible negative pick up rotation of the component before starting the scan at the −20 degree point shown as point 66. Light 55 which escapes around the brick is shown at approximately 1400 pixels. As the block or brick is rotated, the side light information increases to the point 67 where the number of pixels are shown at approximately 1600 after being rotated approximately 20 degrees in the positive direction from minus 20 degrees of original rotation. Point 67 represents the maximum light reaching sensor 63 and coincide with the short side exposure. This point reveals that point 67 is a maximum and an inflection point which is representative of having reached the narrow side of the brick when it is perpendicular to the sheet of light or the light path. Knowing the rotational position, it is also possible to calculate the offset position of the component. The position of the component will permit calculating a correction factor between the axes of the component and the axes of the pick up tool. Further positive rotation of the brick on the pick up tool from point 67 further decreases the sum of light that reaches the linear array 63 until the inflection point 68 is reached which is indicative of the maximum diagonal width for blocking light that can occur for the component. Further positive rotation increases the sum of light reaching the linear array until an inflection point 69 is reached at approximately 1200 pixels, which is indicative of the wide side of the brick being perpendicular to the light axis. Point 69 should occur 90° from point 67 which provides a check of the data being processed. Further, if the component is completely square, then the point 69 and 67 will occur at the same pixel level. This information also permits determining the width and length of a component in terms of pixels which may be converted to actual size and compared with data stored in the computer/processor 47 to determine and verify the type of component being processed. Further positive rotation of the component on the pick up tool causes a decrease in the sum of light reaching the linear array 63 until the inflection point 71 is reached which is indicative of a position that provides the widest possible blocking of light by the rectangular component. At point 69 all of the necessary information has been obtained for the analysis of the brick or component under analysis.

Figure 9:
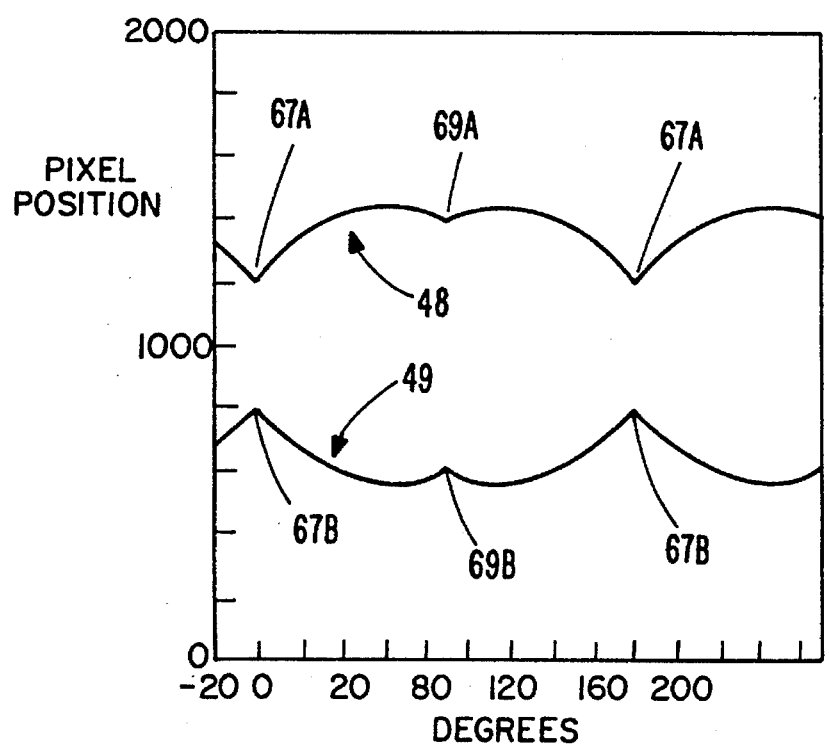
FIG. 9 is an schematic wave form representation of the scan line of a linear array at different angular rotation positions showing how the width, length, and X, Y position of a component may be determined.

Refer now to FIG. 9 which supplements FIG. 8 in that the wave forms depict the scan lines of the linear array at different rotational positions.

The wave form 48 shows that point 67A occurs at pixel position 1200 and that point 67B occurs at pixel position 800. As explained hereinbefore points 67, 67A, and 67B all occur at the rotational position depicted as 0 degrees. In similar manner, when the rotational position of the pick up tool 40 reaches point 69 the computer/controller 47 scans the high density pixels and the wave forms 48 and 49 show points 69A and 69B at approximately 90 degrees of rotation.

The pixel separation between points 67A and 67B is directly proportional to the narrow width W of the component. Similarly, the separation between points 69A and 69B is directly proportional to the length L of the component. Moreover, the pixel position halfway between points 67A, 67B, and 69A, 69B is directly translatable into the X and Y axis, respectively, of the component.

Figure 10:
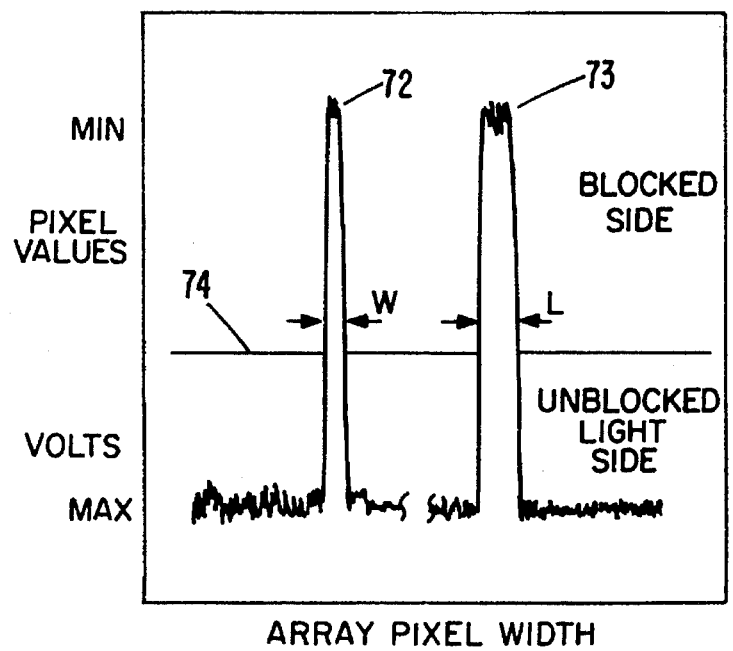
FIG. 10 is a schematic representation wave form of two different components to illustrate the pixel sensor output that is produced for a narrow side and for a wide side of the same component to further illustrate how size of a component can be checked.

Refer now to FIG. 10 which is a schematic representation of an analog wave form of the output of the linear array 63. The linear array produces an analog output from each of the pixels of the array and when scanned will produce the wave form 72. The width W of the wave form 72 at threshold 74 in pixels is the width of the component when its narrow side is perfectly aligned orthogonally to the axis of the sheet of light 55. In similar manner when the block is rotated 90° and the long side is exposed orthogonally to the sheet of light 55 a wave form 73 will be produced having a thickness L shown in pixels. Actual data of a 20 by 40 mil discrete component or brick was measured by plotting the analog output of the linear array 63 which verified the width was 20 mils wide and 40 mils long when the pixels were converted to mils. Having explained the analog information representation output from the linear array 63 with reference to FIG. 10, it will now be understood that the digital information representation with reference to FIG. 8 has been confirmed.

Figure 11:
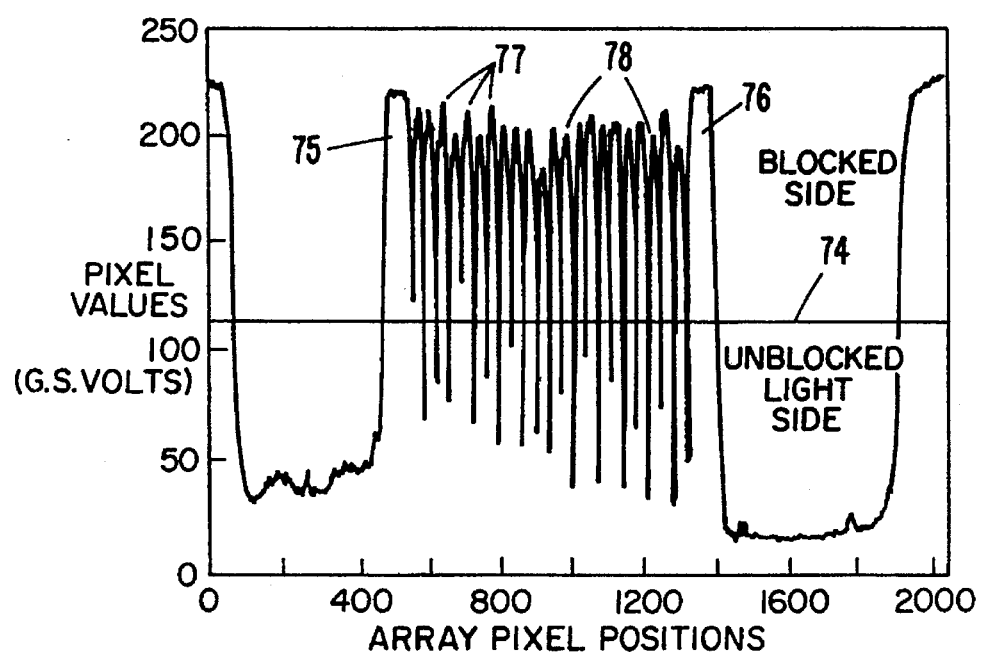
FIG. 11 is a wave form of the type that is produced by collected light on the linear array sensor when the component is being rotated so that portions of the sheet of light pass through the vertical leads of a package when misaligned.

Refer now to FIG. 11 showing a wave form of the type produced by the linear array sensor 63 when sensing the unblocked sheet of light 55 passing through the vertical leads of the semiconductor package 39 of the type shown in FIG. 6. The leads 50 along the sides of the component 39 produce the wave form 75 and 76 at the edges of the component 39. The wave forms 77 depict the output of the linear array when the front leads block the sheet of light 55 projected onto the component 39. The spikes wave forms 78 between the wave form 77 are slightly lower and representative of the leads on the back side of the component 39. The threshold between the light and dark side of the wave forms is again shown as a threshold 74.

Figure 12:
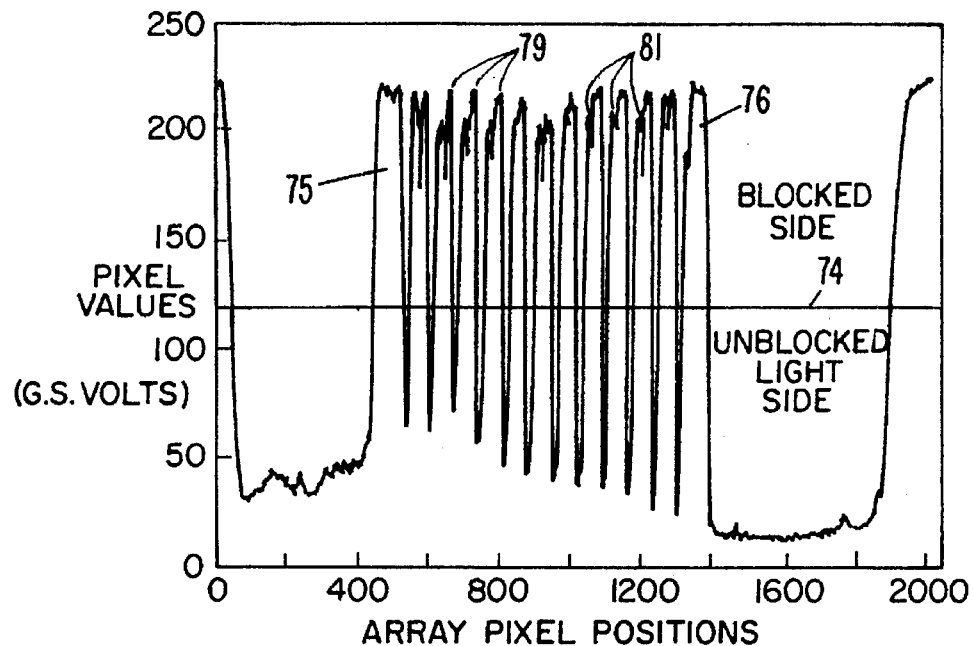
FIG. 12 is a wave form that is produced by the sensor and package of FIG. 11 when the leads of the package are further rotated to an almost aligned position.

Refer now to FIG. 12 showing a wave form produced by the linear array sensor 63 when sensing a package 39 that is very slightly misaligned. The wave form 79 has merged into a wave form 81. The merged wave form 79, 81 is representative of two peaks produced by the front and rear leads. The edge lead wave forms 75 and 76 should remain substantially the same as explained hereinbefore. Again the threshold between the light side and dark side is set at threshold 74.

Figure 13:
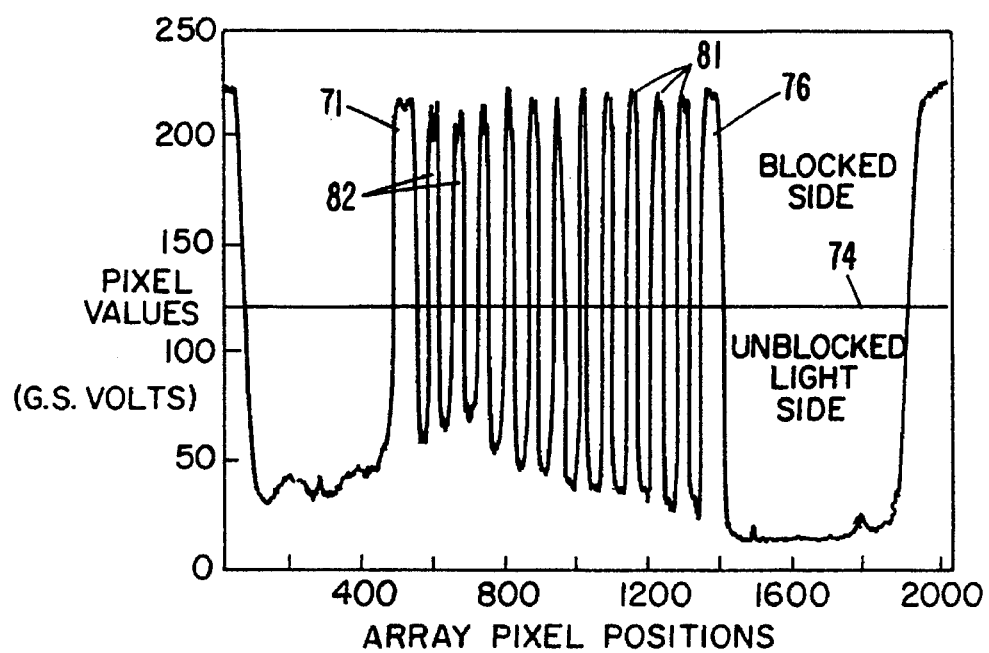
FIG. 13 is a wave form that is produced by the sensor and package of FIGS. 11 and 12 when the leads of the package are further rotated to a perfect alignment.

Refer now to FIG. 13 showing a wave form of the type shown in FIGS. 11 and 12 for the type of package shown in FIG. 6 as component 39 when the leads of the package are perfectly aligned. The edge wave forms 75 and 76 remain substantially the same when the threshold is set at a threshold 74. However, the front leads which are represented by the wave form 81 are clearly separated from each other as if there were no rear leads, provided that none of the front or rear leads are bent. If the front or rear leads are bent it can be detected by analyzing the wave forms 77, 78, 79, 81 and. 82 as shown in FIGS. 11 through 13. When a lead is bent sideways enough to block the space between leads, it will create a wave form approximately twice as wide as a single lead which is in proper alignment. This is easily detected by analyzing the width of individual wave forms. Further, when a lead is slightly bent, the width of the lead appears thicker and it is possible to determine if the amount of bending or distortion is acceptable by setting acceptable tolerances in the computer/processor 47 when making the aforementioned comparisons.

Having explained a preferred embodiment of the present invention, it will be appreciated that the degree of accuracy in measuring the amount of light that reaches the linear array has been substantially enhanced by novel illuminator assembly 51 and the receiver/detector assembly 56. Further enhancement of the accuracy may be increased by using subpixeling techniques between the individual pixel detectors in the linear array sensor 63. Further, the higher the density of the linear array that is used, the higher accuracy before the aforementioned enhancements. It is possible to use a low cost linear array of the type used in hand scanners and other CCD linear array scanners to provide an economical and accurate positioning system when used in conjunction with the present invention optical projection system.

Having explained a preferred embodiment of the present invention, it will be appreciated that the imaging field of collimated light 55 which exists between the lenses 54 and 58 shown in FIG. 7 need only be separated from each other by a distance which is sufficient to accommodate the longest length of a rotated component 39 even when it is in a misaligned position as shown by the phantom lines 39'.

When setting up the apparatus shown in FIGS. 6 and 7, it is desirable to have the point source of light (preferably a bright LED) adjustable so that it creates a fan of light L which is wide enough to accommodate the widest component 39 to be positioned. Further, the collimating lens 54 is preferably adjustable so that the fan of light L is properly collimated in the object field of light 55. In a similar manner, the thin slitted aperture plate 59 and the positive relay lens 62 are preferably adjustable so that the maximum amount of refocused collimated light 55" occurs in the back focus distance between relay lens 62 and linear array 63 and the sharpest possible image focus is provided on the linear array sensors.

Having explained a preferred light source field L and a preferred object field 55 and a refocused back focus field 55", it will be appreciated that the system shown in FIGS. 6 and 7 is generically classified as a telecentric system having an infinite depth of object field and that any component or part thereof which is placed in the object field 55 will be in focus and does not produce diverging cones of light rays impinging on the objective lens 58. Thus, the back focus field 55" has the sharpest possible refocused cones of light that can be provided with the accuracy of the lens system used in the positioning system of FIGS. 6 and 7. The novel system permits the determination of the Z position of individual leads which was not possible with known prior art systems. Thus, component co-linearity and co-planarity can be checked against tolerances stored in the programmable memory so that faulty components are not placed on circuit boards and substrates.

What is claimed is:

1. Apparatus for determining the position of a component, comprising:

a movable frame, pick up means mounted on said movable frame and movable with said frame for picking up and supporting a component to be positioned on a work piece, collimating lens means for producing a thin wide sheet of non-coherent collimated light which is projected onto and illuminates a component held by said pick up means in an object field, objective lens means for receiving and refocusing the portion of said thin wide sheet of non-coherent collimated light not blocked by said component to provide a focused image, relay projection lens means for receiving the focused light not blocked and for producing refocused collimated light rays, linear array sensing means mounted on said movable frame for receiving said refocused collimated light rays and the projected image, said linear array sensing means having a plurality of pixel sensors whose position is known relative to said pick up means, drive means coupled to said pick up means for rotating said component whose position is to be determined, encoder means coupled to said pick up means, a computer/controller coupled to said drive means, said linear array sensor means and to said encoder means for producing sets of X, Y and Θ digital data indicative of said image and said refocused collimated light rays projected onto said pixel sensors, and said computer/controller comprising means for analyzing said digital data and for determining the X, Y and Θ position of said component relative to said pick up means.

2. Apparatus as set forth in claim 1 which further includes telecentric aperture means between said objective lens means and relay projection lens means for eliminating uncoillimated refocused light rays and for providing an enhanced telecentric lens system.

3. Apparatus as set forth in claim 2 wherein said telecentric aperture means comprises a thin slitted aperture for blocking stray light from said thin wide sheet of non-coherent collimated light.

4. Apparatus as set forth in claim 1 wherein said collimating lens means for producing said thin wide sheet of non-coherent collimated light comprises a non-coherent light source, a diffusing lens and a light collimating positive lens.

5. Apparatus as set forth in claim 1 wherein said collimating lens means for producing a wide thin sheet of non-coherent collimated light further includes prism means for reversing the direction of said sheet of light by 180°.

6. Apparatus as set forth in claim 1 wherein said computer/controller comprises programmable memory means programmed for performing analysis of different components and devices.

7. Apparatus as set forth in claim 1 wherein said computer/controller further comprises means for moving said pick up means in a vertical or a Z axis direction, means for simultaneously positioning said pick up means in said wide sheet of collimated light and for setting the vertical Z axis and the tip position of said pick up means in said computer/controller.

8. Apparatus as set forth in claim 7 wherein said computer/controller further includes means for determining the actual Z position and thickness of parts of components held on said pick up means.

9. Apparatus as set forth in claim 7 wherein said component comprises a leaded component, and said computer/controller comprises means for determining the lead width, pitch or Z height of said component for diagnostic purposes.

10. Apparatus as set forth in claim 1 wherein said component comprises parallel rows of depending attachment leads positioned in said wide sheet of collimated light, and said computer/controller comprises means for aligning said parallel rows of depending attachment leads orthogonal to said thin wide sheet of non-coherent collimated light so that a maximum of unblocked refocused collimated light rays pass through said leads and impinge on said sensor means.

11. Apparatus as set forth in claim 10 wherein said computer/controller comprises means for determining the width of independent depending leads.

12. Apparatus as set forth in claim 1 wherein said component comprises parallel rows of depending attachment leads and said computer/controller comprises means for misaligning said parallel rows of depending attachment leads so that both parallel rows of attachment leads block some of the wide sheet of collimated light, and said computer/controller comprises means for determining the width and pitch of individual leads and for determining if an individual lead is not in position.

13. Apparatus for determining the position of a component relative to a sensor, comprising:

a movable frame, non-coherent light source means mounted on said movable frame, collimating lens means mounted on said movable frame and comprising a segment of a positive lens for producing a wide sheet of non-coherent collimated light, objective focusing lens means mounted on said movable frame and spaced apart from said collimating light means for receiving said wide sheet of collimated light and for refocusing rays of unblocked light when a component is positioned in said wide sheet of collimated light, relay projection lens means mounted on said movable frame for receiving an image of said rays of unblocked light and for generating refocused collimated rays of unblocked light, linear array sensing means mounted on said movable frame for receiving said refocused collimated rays of unblocked light, said linear array sensing means comprising a plurality of high density sensors for generating individual signals indicative of an image of a ray of unblocked light, and computer/controller means coupled to said linear array sensing means for receiving sets of data indicative of a plurality of rotational positions of said components when placed in said wide sheet of collimated light and for determining the width, length and offset position of said component and the axis of rotation of said component.

14. A method for accurately determining the alignment of a component picked up and held by a placement tool, comprising the steps of:

providing a placement tool on a movable head, providing a position sensing apparatus on said movable head juxtaposed said placement tool, generating a thin wide sheet of collimated light in an object light field, placing said component in said object light field to block parallel ray portions of said thin wide sheet of collimated light, projecting the unblocked ray portions of said thin wide sheet of collimated light through an objective focusing lens to produce an image of the unblocked light, passing the focused light from said objective focusing lens through a telecentric aperture, refocusing the focused light through a relay projection lens to produce an image of said thin sheet of focused collimated unblocked parallel light rays in a back focus field, projecting the image of the focused collimated unblocked parallel light rays onto a linear array detector coupled to a computer/controller, rotating said component in said object light field while held by said placement tool to produce data representative of different unblocked parallel light rays at different rotational positions, and analyzing said data in said computer/controller to determine the X, Y and $\Theta$ position of said component relative to said placement tool.

\* \* \* \* \*